United States Patent [19]

Nakata et al.

[11] Patent Number: 5,301,349
[45] Date of Patent: Apr. 5, 1994

[54] SINGLE CHIP COMPUTER HAVING GROUND WIRE FORMED IMMEDIATELY PARALLEL A DATA BUS AND DRIVERS FORMED DIRECTLY UNDER THE DATA BUS FOR HIGH SPEED DATA TRANSFER

[75] Inventors: Shigeharu Nakata, Fujisawa; Kazumasa Andoh, Kawasaki, both of Japan

[73] Assignee: Kabushiki Kaisha Toshiba, Kawasaki, Japan

[21] Appl. No.: 928,769

[22] Filed: Aug. 17, 1992

Related U.S. Application Data

[60] Division of Ser. No. 671,139, Mar. 18, 1991, abandoned, which is a continuation of Ser. No. 458,436, Dec. 28, 1989, abandoned.

[30] Foreign Application Priority Data

Dec. 28, 1988 [JP] Japan ................................ 63-333615

[51] Int. Cl.$^5$ ............................................ G06F 11/18
[52] U.S. Cl. .................................. 395/800; 395/325; 364/491; 364/240.1; 364/240.5; 364/DIG. 1; 257/499
[58] Field of Search ................ 357/45, 40, 41; 395/275, 325, 800; 364/491

[56] References Cited

U.S. PATENT DOCUMENTS

| | | | |
|---|---|---|---|
| 4,329,685 | 5/1982 | Mahon et al. | 340/825.84 |
| 4,514,749 | 4/1985 | Shoji | 257/664 |
| 4,516,123 | 5/1985 | Shoji | 340/825.86 |
| 4,716,308 | 12/1987 | Matsuo et al. | 357/45 |
| 4,851,891 | 7/1989 | Kubosawa et al. | 357/45 |
| 4,857,981 | 8/1989 | Matsumoto et al. | 357/45 |
| 4,951,111 | 8/1990 | Yamamoto | 357/45 |
| 4,967,344 | 6/1990 | Scavezze et al. | 395/575 |
| 4,979,095 | 12/1990 | Ghaffari | 395/325 |
| 4,994,963 | 2/1991 | Rorden et al. | 395/325 |
| 5,066,831 | 11/1991 | Spielberger et al. | 174/52.4 |
| 5,165,085 | 11/1992 | Kamejima et al. | 364/491 |
| 5,214,655 | 5/1993 | Eichelberger et al. | 371/22.5 |

FOREIGN PATENT DOCUMENTS

0133023  2/1985  European Pat. Off. .

OTHER PUBLICATIONS

IBM Technical Disclosure Bulletin, vol. 19, No. 6, 1976, pp. 2303-2304, "Polysilicon Gate Mosfets For Weinberger-Type Random Logic Arrays"; P. W. Cook et al.

Primary Examiner—Thomas C. Lee
Assistant Examiner—Paul Harrity
Attorney, Agent, or Firm—Oblon, Spivak, McClelland, Maier & Neustadt

[57] ABSTRACT

A semiconductor integrated circuit comprises a plurality of bus line means for transferring data, a plurality of bus line driving means, connected to the bus line means and including one or more FETs, for determining a logical level of the bus line means, and a ground potential wire connected to the bus line driving means and arranged parallel to the bus line means.

20 Claims, 8 Drawing Sheets

SINGLE CHIP COMPUTER HAVING GROUND WIRE FORMED IMMEDIATELY PARALLEL A DATA BUS AND DRIVERS FORMED DIRECTLY UNDER THE DATA BUS FOR HIGH SPEED DATA TRANSFER

This application is a division of application Ser. No. 07/671,139, filed on Mar. 18, 1991, now abandoned, which is a continuation of application Ser. No. 07/458,436, filed Dec. 28, 1989, abandoned.

BACKGROUND OF THE INVENTION

1. Field of the Invention

The present invention relates to a semiconductor integrated circuit having an element region and a wiring region, wherein a data bus formed in the wiring region is driven by a bus driver circuit.

2. Description of the Related Art

FIG. 5 is a block diagram showing a layout of a common microcontroller. The microcontroller includes various function blocks such as CPU 11, ROM 12, RAM 13, timer 14 and I/0 port 15. Data transfer among these function blocks is performed through data bus 16, which comprises signal lines for data transfer. Fou signal lines are used in a 4-bit microcontroller and eight signal lines are used in an 8-bit microcontroller.

FIG. 6 is a circuit diagram showing part of an 8-bit microcontroller having a layout such as shown in FIG. 5 and which includes data bus 16 having eight signal lines D0 to D7, timer 14, and I/0 port 15. FIG. 7 is a timing chart showing an example of data transfer performed using signal line D5 of data bus 16.

When clock signal $\phi$ is in a period of "1", P-channel MOS transistor 21 connected to signal line D5 is turned on and signal line D5 is precharged. Data on signal line D5 thus becomes "1". If control signal A is "1" when clock signal $\phi$ is in a period of "1", an output of AND gate 22 in timer 14 is "1" and N-channel MOS transistor 23, supplied with the output of gate 22, is turned on. If data $\overline{\text{DATA1}}$ timer 14 is "1", N-channel MOS transistor 24 is turned on, so that signal line D5 is discharged as a reference voltage (GND) and data on signal line D5 becomes "0". If control signal B in I/O port 15 is "1" during this period, an output of AND gate 25 becomes "1". Data "0" on signal line D5 is latched by latch circuit 26, which is supplied with the output of gate 25 as a clock signal, and its inverted output data $\overline{\text{DATA2}}$ becomes "1". (period T1 in FIG. 7)

If control signal B is "0" when clock signal $\phi$ is "1", control signal A is "1" and data $\overline{\text{DATA1}}$ is "1", data on signal line D5 is set at "0" by timer 14. Since no clock signal is supplied to latch circuit 26 in I/O port 15, output data $\overline{\text{DATA2}}$ of latch circuit 26 does not vary. (period T2 in FIG. 7)

If data $\overline{\text{Data1}}$ in timer 14 is "0" when clock signal $\phi$ is "1" and control signal A is "1", N-channel MOS transistor 23 is turned off. Since a current path extending from signal line D5 to reference voltage GND is not formed in this case, data "1" of precharged signal line D5 is held dynamically as it is by the parasitic capacitance of signal line D5. If control signal B is "1" during this period, data "1" on signal line D5 is latched by latch circuit 26 and its inverted output data $\overline{\text{DATA2}}$ becomes "0". (period T3 in FIG. 7)

When data is transferred using a data bus as described above, the transfer of data depends on whether charges previously stored in the parasitic capacitance of the data bus during the precharge period are emitted or not. This method of data transfer has a drawback in that no data can be transferred during the precharge period when charges are stored in the parasitic capacitance of the data bus, but also has the advantage in that since the MOS transistors 23 and 24, which are used as bus drivers for driving the data bus, are both constituted by N-channel MOS transistors, the parasitic capacitance of the data bus is smaller than that of a CMOS type bus driver using both a P-channel and an N-channel MOS transistors, with the result that data can be transferred at high speed.

FIG. 8 is a plan view showing a conventional pattern in which the N-channel MOS transistors 23 and 24 constituting a bus driver in the circuit shown in FIG. 6 are formed on an LSI. The components of FIG. 8 corresponding to those of FIG. 6 are indicated by the same reference numerals. Eight signal lines D0 to D7, constituting data bus 16, are made of metal such as aluminum and formed in wiring region 30 on a chip. Other signal lines 31 adjacent to signal line D7 are formed within wiring region 30. Signal lines 31 are also made of aluminum, as is power supply wire 33 for reference voltage (GND), and which is formed within element region 32 adjacent to signal line 31.

In FIG. 8, reference numerals 34, 35, and 36 denote N-type diffusion layers serving as the source and drain regions of N-channel MOS transistors 23 and 24. Diffusion layer 34 contacts signal line D5 through contact hole 37, and diffusion layer 36 contacts power supply wire 33 through contact hole 38. Polycrystalline silicon wire 39, which serves as a gate electrode of N-channel MOS transistor 23 and is supplied with signal A·$\phi$ output from AND gate 22, is interposed between diffusion layers 34 and 35. Similarly, polycrystalline silicon wire 40, which serves as a gate electrode of N-channel MOS transistor 24 and is supplied with data $\overline{\text{Data1}}$, is interposed between diffusion layers 35 and 36.

As described above, in the conventional semiconductor integrated circuit, the power supply wire for GND connected to the bus driver is formed within the element region and is used to constitute a logic circuit. There are many cases where various elements, now shown, are formed between wiring region 30 and power supply wire 33 formed within element region 32. Inevitably, diffusion layer 36 is lengthened and an equivalent resistance in diffusion layer 36 is increased.

The function blocks housed in the LSI perform complicated processings. The larger the constitution of the function blocks, the larger is wiring region 30. Further, since the bit length of data is increased from 4 bit or 8 bit to 16 bit or 32 bit, the wiring region is enlarged.

FIG. 9 is a plan view showing a pattern corresponding to that of FIG. 8, wherein data is 32 bits in length and the number of signal lines of data bus 16 is increased up to 32 (D0 to D31), resulting in wiring region 30 being enlarged. With wiring region 30 enlarged, the length of diffusion layer 36 is greater than in the pattern shown in FIG. 8.

FIG. 10 illustrates an equivalent circuit of the bus driver shown in FIG. 9. Since N type diffusion layer 36 is lengthened in this circuit, resistor R having a high resistance is equivalently inserted between the source of transistor 24 (shown in FIG. 8) and power supply wire 33 for GND in the bus driver. Consequently, the discharge characteristic of signal line D5 is degraded. More specifically, when signal line D5 is discharged, a current flows through two MOS transistors 23 and 24 and resistor R which are connected in series. Then, a voltage drop occurs on resistor R and the potential at the source region of transistor 24 is increased. As a result, transistor 24, which is operated at point a shown in FIG. 11 at the beginning of the flow of current, is operated at point b, since both voltage $V_{DS}$ between the source and drain regions and voltage $V_{GS}$ between the gate and the source region are lowered by the increase in the source potential. The current flowing into the bus driver is thus reduced and the time required for discharging signal line D5 is lengthened. The increase in the source potential causes difference $V_{BS}$ between the source potential and a potential under the channel region of the N-channel MOS transistor to be reduced. Therefore, a strong back gate bias effect is generated by the N-channel MOS transistor, and the current is reduced further, increasing the threshold voltage.

As described above, in the conventional integrated circuit, the bus driver circuit is connected to the power supply wire formed in the element region through long diffusion layer 36 including resistive components, with the result that the discharge characteristic of the bus driver circuit is degraded and thus data cannot be transferred at high speed.

SUMMARY OF THE INVENTION

An object of the present invention is to provide a semiconductor integrated circuit wherein data can be transferred in a data bus at high speed without degrading the discharge characteristic of a bus driver circuit.

A semiconductor integrated circuit according to the present invention comprises a plurality of bus line means (D0 to D7) for transferring data, bus line driving means (34 to 39), connected to the bus line means (D0 to D7) and including one or more FETs, for determining a logical level of the bus line means (D0 to D7), and a ground potential wire (41) formed parallel to the bus line means (D0 to D7).

A semiconductor integrated circuit having the above construction allows data to be transferred at high speed. In the conventional semiconductor integrated circuit, the distance between the ground potential and the bus line driving means is comparatively long and these elements are connected to each other by extending a diffusion layer of an FET. For this reason, it takes time for charges to flow into the ground potential and for the potential of the bus line to become equal to the ground potential; accordingly, the processing speed of the semiconductor integrated circuit decreases. Since, in the present invention, the ground potential wire is formed contiguous with the FET included in the bus line driving means, electrical resistance components are reduced and the time required for equalizing the potentials of the bus line and ground potential wire is shortened. In the semiconductor integrated circuit of the present invention, therefore, data processing can be performed at high speed.

DETAILED DESCRIPTION OF THE PREFERRED EMBODIMENTS

Embodiments of the present invention will now be described below, with reference to the accompanying drawings.

Figure 1:
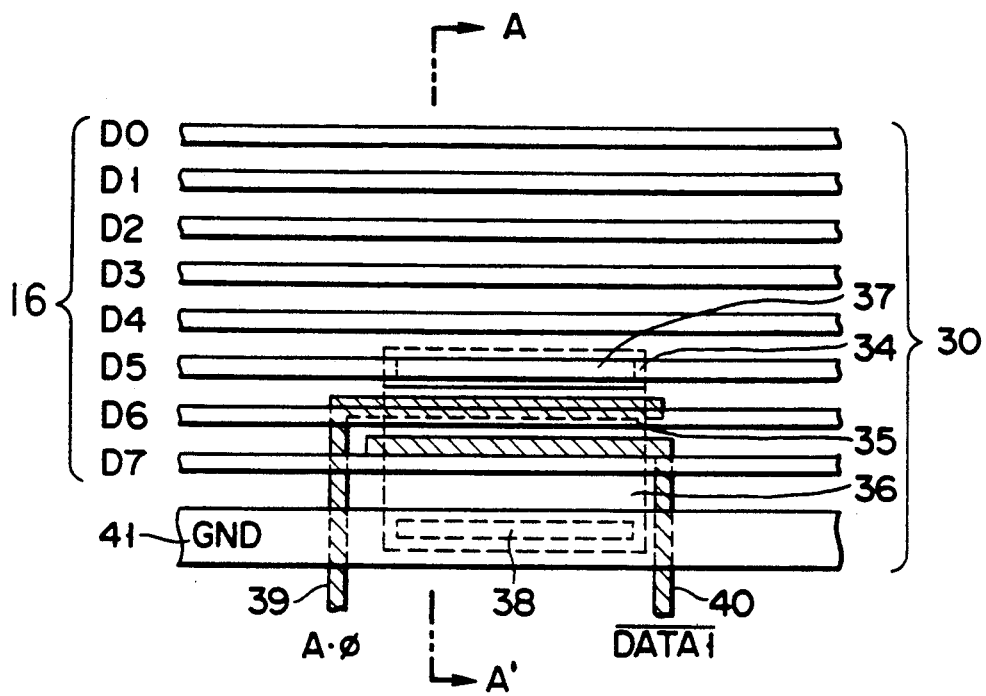
FIG. 1 is a plan view showing a pattern of a semiconductor integrated circuit according to a first embodiment of the present invention.
Figure 6:
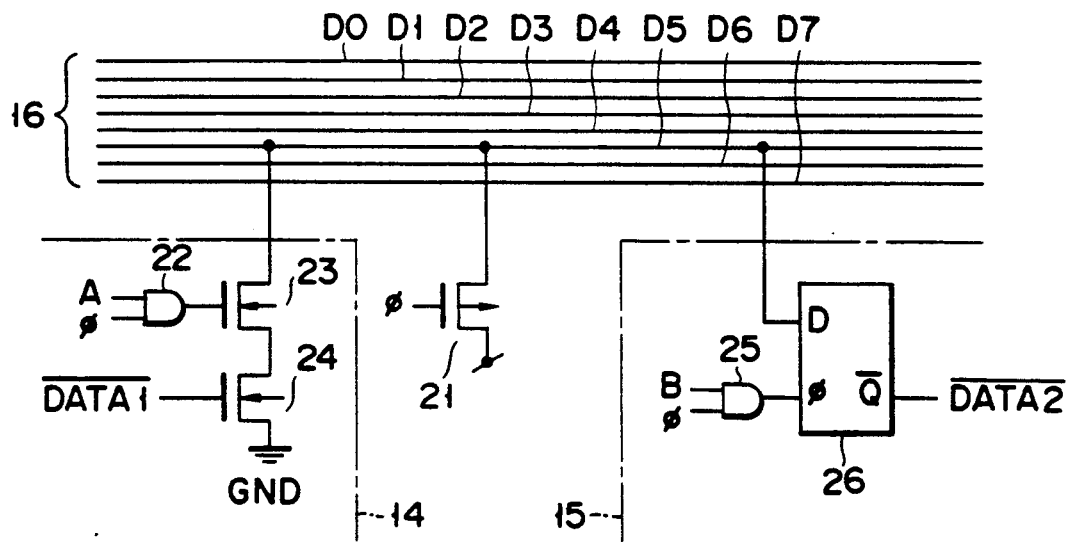
FIG. 6 is a circuit diagram specifically showing part of the micro-controller shown in FIG. 5.
Figure 7:
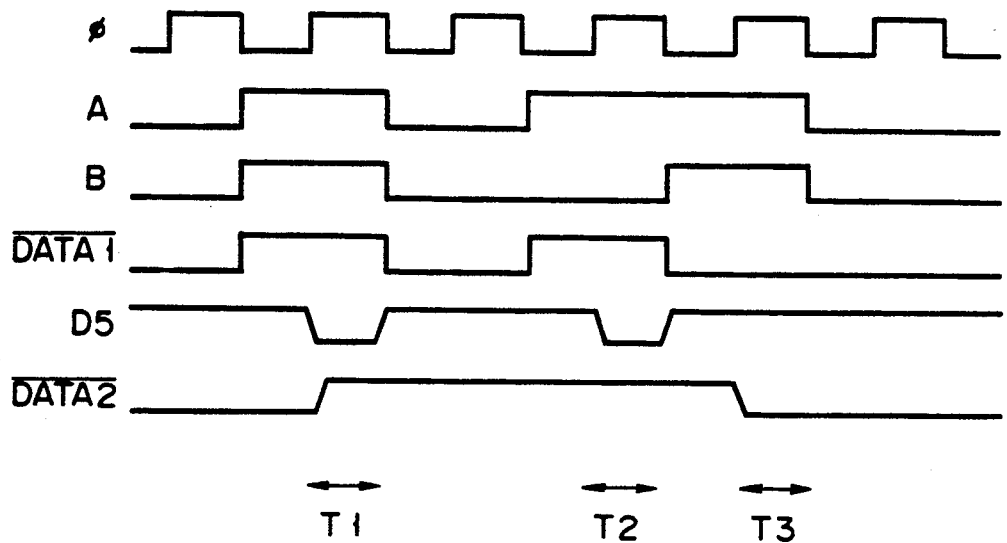
FIG. 7 is a timing chart showing an example of an operation of the circuit shown in FIG. 6.
Figure 8:
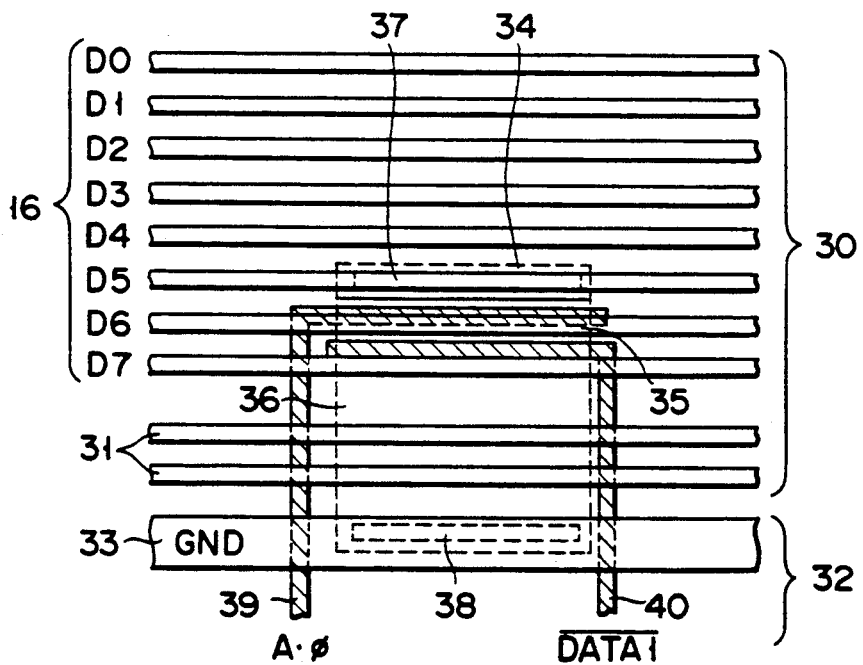
FIG. 8 is a plan view showing a partial pattern of a conventional semiconductor integrated circuit, in which the circuit shown in FIG. 6 is formed on an LSI.
Figure 9:
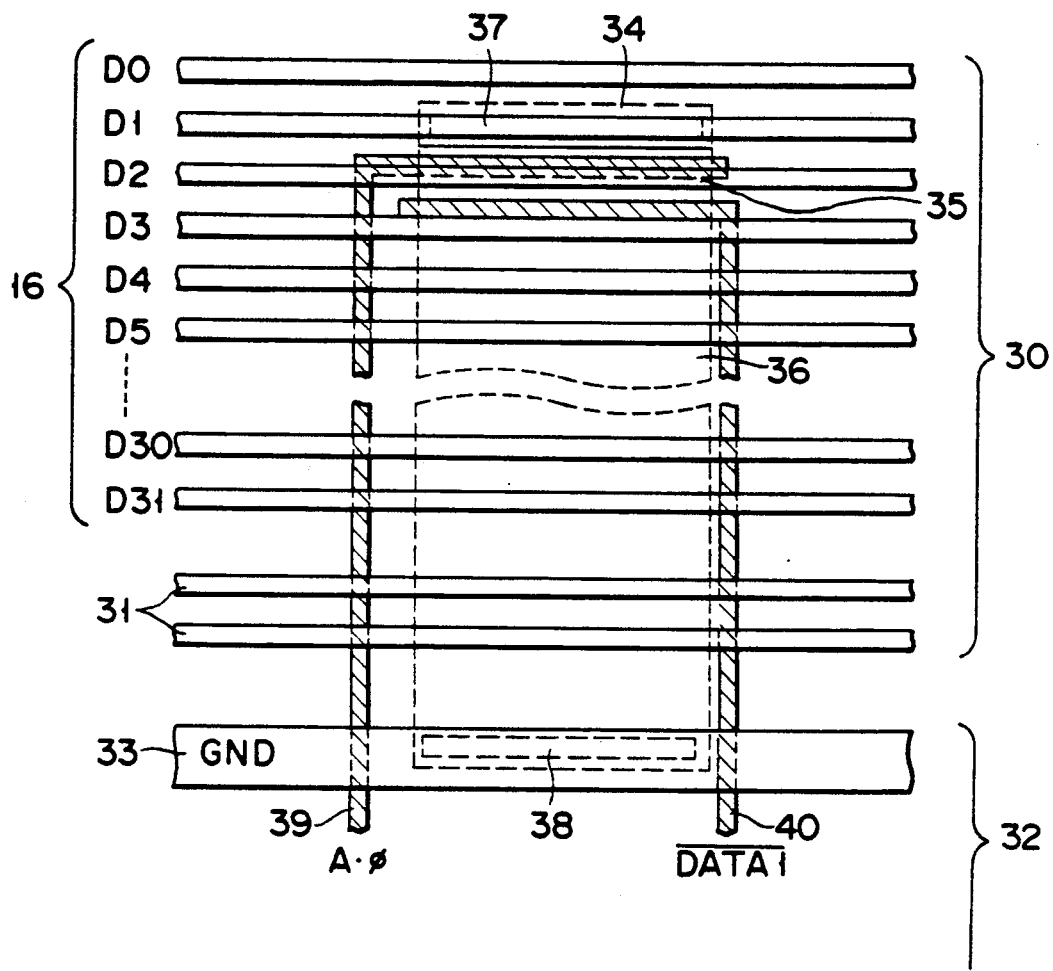
FIG. 9 is a plan view showing a pattern in which a wiring region of the circuit shown in FIG. 8 is enlarged.

FIG. 1 is a plan view of a pattern of a semiconductor integrated circuit according to the first embodiment of the present invention. In the circuit shown in FIG. 1, two N-channel MOS transistors, 23 and 24, constituting the bus driver shown in FIG. 6 are formed on an LSI. The components of FIG. 1 corresponding to those of FIG. 6 are represented by the same reference numerals. Data bus 16 comprises eight signal lines D0 to D7 which are made of metal such as aluminum and it is formed in wiring region 30 on a chip. Power supply line 41 for reference voltage (GND), which is made of aluminum and is adjacent to data bus 16, is formed within wiring region 30. If silver, copper, or tungsten is substituted for aluminum, the conductivity of the lines can be achieved with lower resistance.

In FIG. 1, reference numerals 34, 35, and 36 denote N type diffusion layers which serve as a source and a drain regions of N-channel MOS transistors 23 and 24. Diffusion layer 34 is connected to a single signal line, e.g., signal line D5 through contact hole 37, and diffusion layer 36 is connected to power supply wire 41 through contact hole 38. Polycrystalline silicon wire 39, which serves as a gate electrode of N-channel MOS transistor 23 and is supplied with signal A·φ from AND gate 22, is interposed between diffusion layers 34 and 35. Similarly, polycrystalline silicon wire 40, which serves as a gate electrode of N-channel MOS transistor 24 and is supplied with data $\overline{Data1}$, is interposed between diffusion layers 35 and 36.

Figure 2:
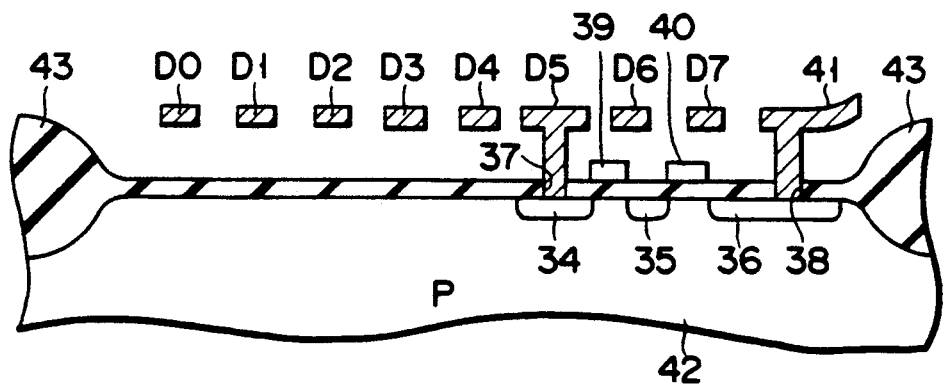
FIG. 2 is a cross-sectional view showing an element structure along the line A—A' of FIG. 1.

FIG. 2 is a cross-sectional view showing an element structure along the line of A—A' of FIG. 1. In FIG. 2, numeral 42 indicates a P type substrate and 43 denotes a field oxide film.

Figure 10:
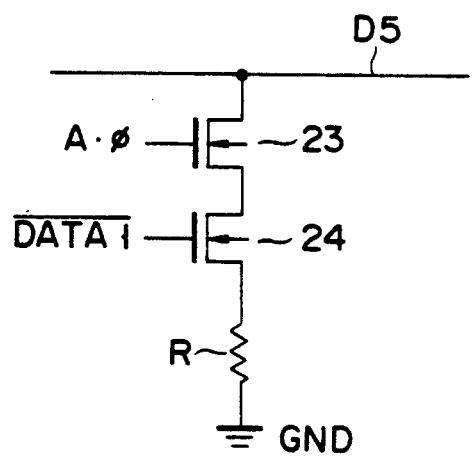
FIG. 10 is an equivalent circuit diagram of a bus driver shown in FIG. 9.
Figure 11:
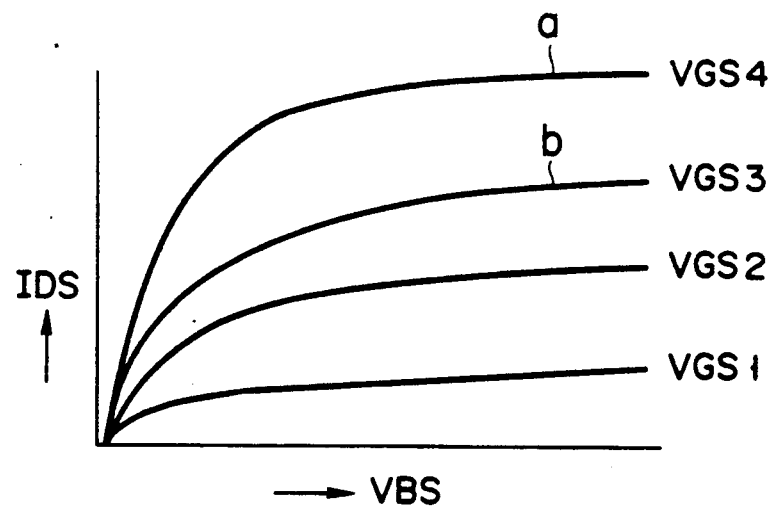
FIG. 11 is a graph showing a characteristic of the equivalent circuit shown in FIG. 10.

In the embodiment shown in FIG. 2, power supply wire 41 exclusively for the bus driver is formed within wiring region 30, and diffusion layer 36 of the N-channel MOS transistors functioning as the bus driver is connected to power supply wire 41. Since such elements formed within the element region as in the conventional circuit are not interposed between data bus 16 and power supply 41, diffusion layer 36 can therefore be shorter than the diffusion layer of the conventional circuit. As a result, the resistance of resistor R in the equivalent circuit shown in FIG. 10 can be lowered and degradation of the discharge characteristic of the data bus can thus be prevented. In other words, the data bus can be discharged in a short time and thus data can be transferred at high speed.

Figure 3:
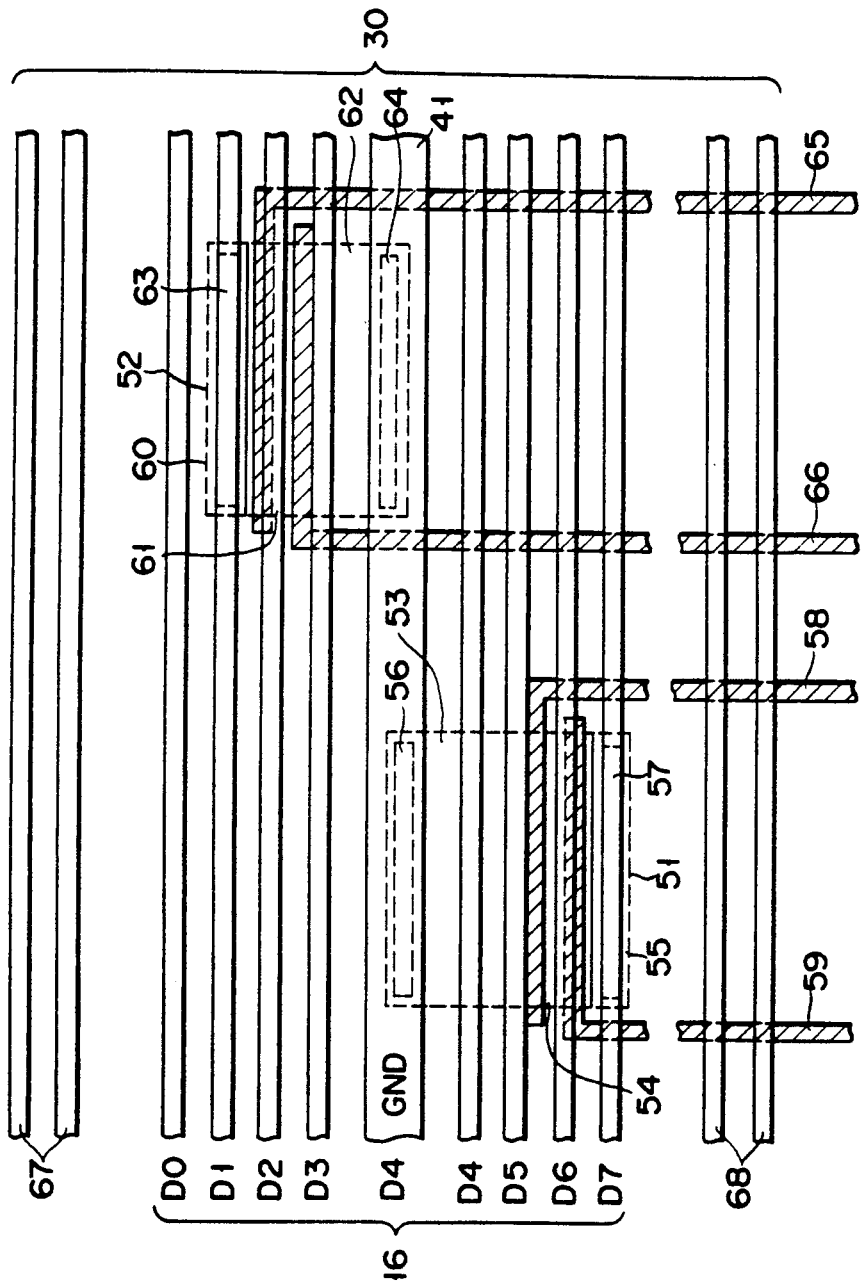
FIG. 3 is a plan view showing a pattern of a semiconductor integrated circuit according to a second embodiment of the present invention.

FIG. 3 is a plan view showing a pattern of a semiconductor integrated circuit according to a second embodiment of the present invention. In the second embodiment, power supply wire 41 is arranged between signal lines D3 and D4 of the eight signal lines D0 to D7 constituting data bus 16. FIG. 3 shows bus driver 51 for driving signal line D7 of data bus 16 and bus driver 52 for driving signal line D1 of data bus 16. N type diffusion layers 53, 54, and 55 constitute the source and drain regions of two N-channel MOS transistors within bus driver 51. Diffusion layer 53 is connected to power supply wire 41 through contact hole 56 and diffusion layer 55 is connected to signal line D7 through contact hole 57. Polycrystalline silicon wire 58, which serves as a gate electrode of one of N-channel MOS transistors, is formed between diffusion layers 53 and 54, and polycrystalline silicon wire 59, which serves as a gate electrode of the other N-channel MOS transistor, is formed between diffusion layers 54 and 55. Similarly, N type diffusion layers 60, 61, and 62 constitute the source and drain regions of two N-channel MOS transistors within bus driver 52. Diffusion layer 60 is connected to signal line D1 through contact hole 63 and diffusion layer 62 is connected to power supply wire 41 through contact hole 64. Polycrystalline silicon wire 65, which serves as a gate electrode of one of the N-channel MOS transistors, is formed between diffusion layers 60 and 61, and polycrystalline silicon wire 66, which serves as a gate electrode of the other N-channel MOS transistor, is formed between diffusion layers 61 and 62. Within region 30, signal line 67 is formed contiguous with signal line D0 of data bus 16, and signal line 68 is formed contiguous with signal line D7 thereof.

When power supply wire 41 is arranged between signal lines D3 and D4 of the eight signal lines D0 to D7 constituting data bus 16, as in the second embodiment, the distance between power supply wire 41 and signal line D0 or D7 within data bus 16, which is the farthest from power supply wire 41, corresponds to the width of at most three signal lines. In the first embodiment, shown in FIG. 1, the distance between power supply wire 41 and signal line D0 within data bus 16, which is farthest from power supply wire 41, corresponds to the width of seven or more signal lines. Consequently, the longest discharge time of the data bus in the second embodiment ca be made shorter than that of the data bus in the first embodiment.

Figure 4:
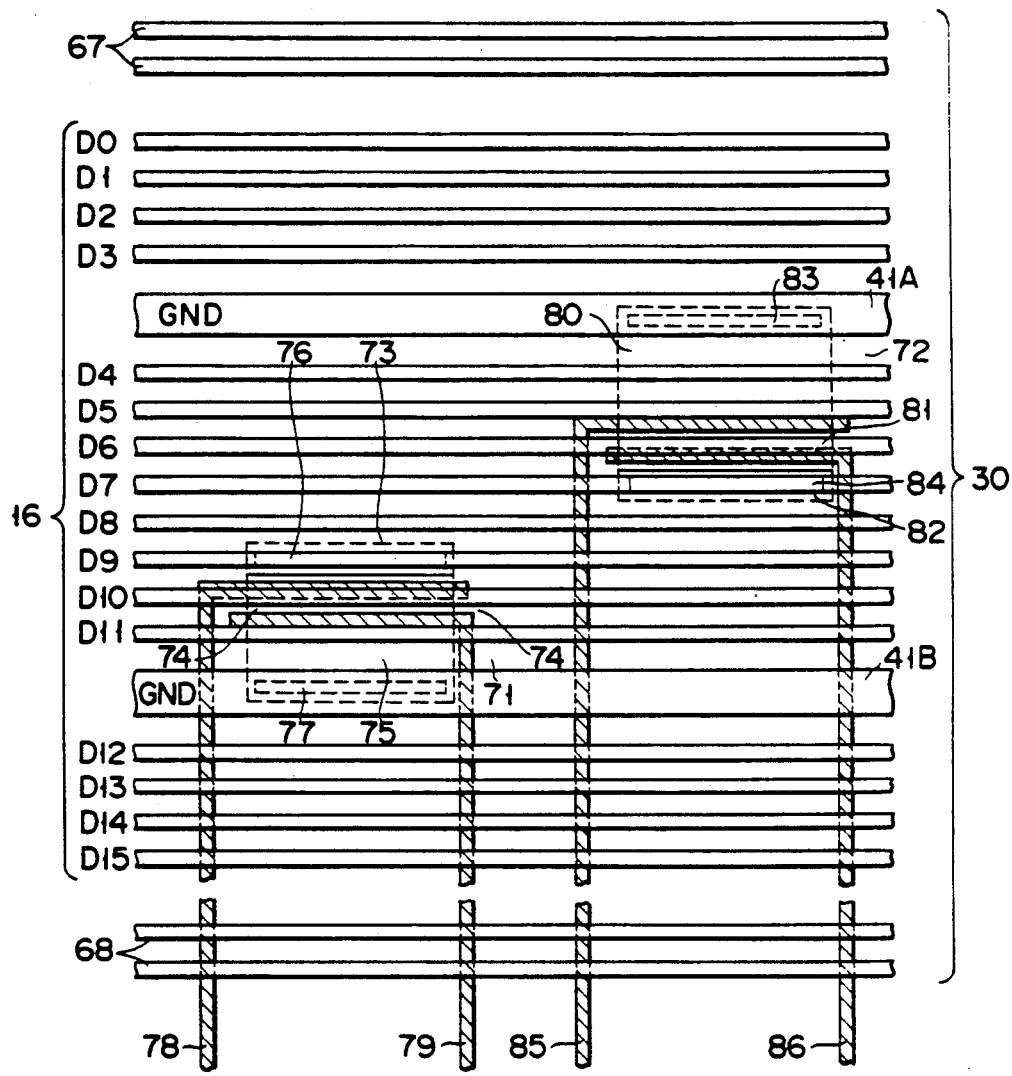
FIG. 4 is a plan view showing a pattern of a semiconductor integrated circuit according to a third embodiment of the present invention.
Figure 5:
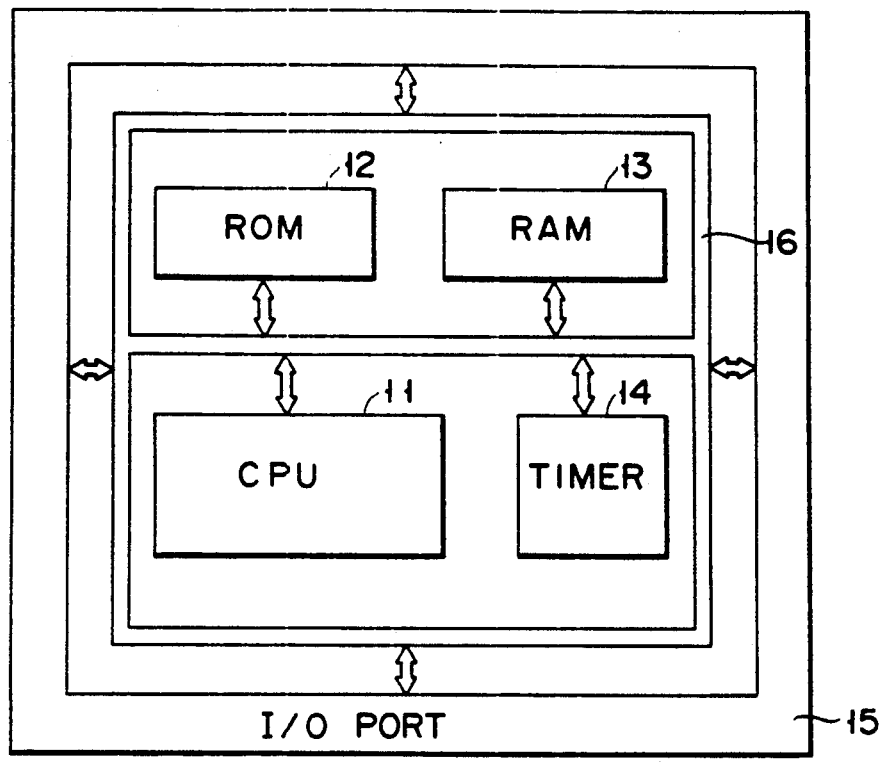
FIG. 5 is a block diagram showing a layout of a common micro-controller.

FIG. 4 is a plan view showing a pattern of a semiconductor integrated circuit according to a third embodiment of the present invention. In the third embodiment, data bus 16 comprises 16 signal lines D0 to D15 and two power supply wires, 41A and 41B, which are arranged between the signal lines, power supply line 41A being arranged between signal lines D3 and D4, and power supply wire 41B arranged between signal lines D11 and D12. FIG. 4 illustrates bus driver 71 for driving signal line D9 of data bus 16 and bus driver 72 for driving signal line D7 of data bus 16. N type diffusion layers 73, 74, and 75 constitute the source and drain regions of two N-channel MOS transistors in bus driver 71. Diffusion layer 73 is connected to signal line D9 through contact hole 76, and diffusion layer 75 is connected to power supply wire 41B through contact hole 77. Polycrystalline silicon wire 78, which serves a gate electrode of one of the N-channel MOS transistors, is interposed between diffusion layers 73 and 74, and polycrystalline silicon wire 79, which serves as a gate electrode of the other N-channel MOS transistor, is interposed between diffusion layers 74 and 75. Similarly, N type diffusion layers 80, 81, and 82 constitute the source and drain regions of two N-channel MOS transistors in bus driver 72. Diffusion layer 80 is connected to power supply wire 41A through contact hole 83, and diffusion layer 82 is connected to signal line D7 through contact hole 84. Polycrystalline silicon wire 85, which serves as a gate electrode of one of the N-channel MOS transistors, is interposed between diffusion layers 80 and 81, and polycrystalline silicon wire 86, which serves as a gate electrode of the other N-channel MOS transistor, is interposed between diffusion layers 81 and 82. Within wiring region 30, signal line 67 is formed contiguous with signal line D0 of data bus 16 and signal line 68 is formed contiguous with signal line D7 thereof.

In the third embodiment, the signal lines of the data bus are increased in number and wiring region 30 is enlarged, the number of power supply wires for GND formed within wiring region 30 is increased when the need arises. In this embodiment, therefore, even if the signal lines of the data bus is increased in number and wiring region 30 is enlarged, the length of each diffusion layer connected to the power supply wire for GND can still be shorter than that in the case of the conventional apparatus. Thus, it is possible to transfer data at high speed.

In the third embodiment, the number of the power supply wires is not limited to two but can be set to two or more in accordance with the number of signal lines constituting the data bus.

Figure 12A:
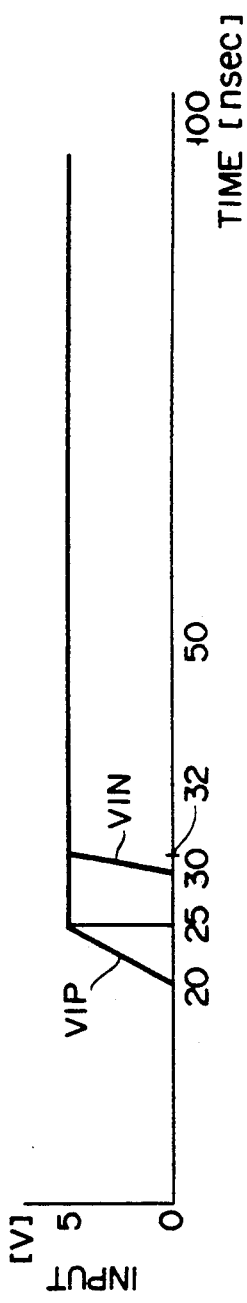
FIG. 12A graphically shows a simulation results obtained from the semiconductor integrated circuit of the present invention.
Figure 12C:
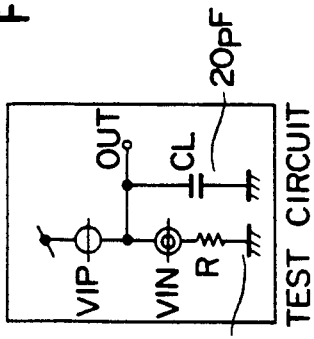
FIG. 12C is an equivalent circuit diagram by which the simulation data of FIG. 12B were derived.
Figure 12B:
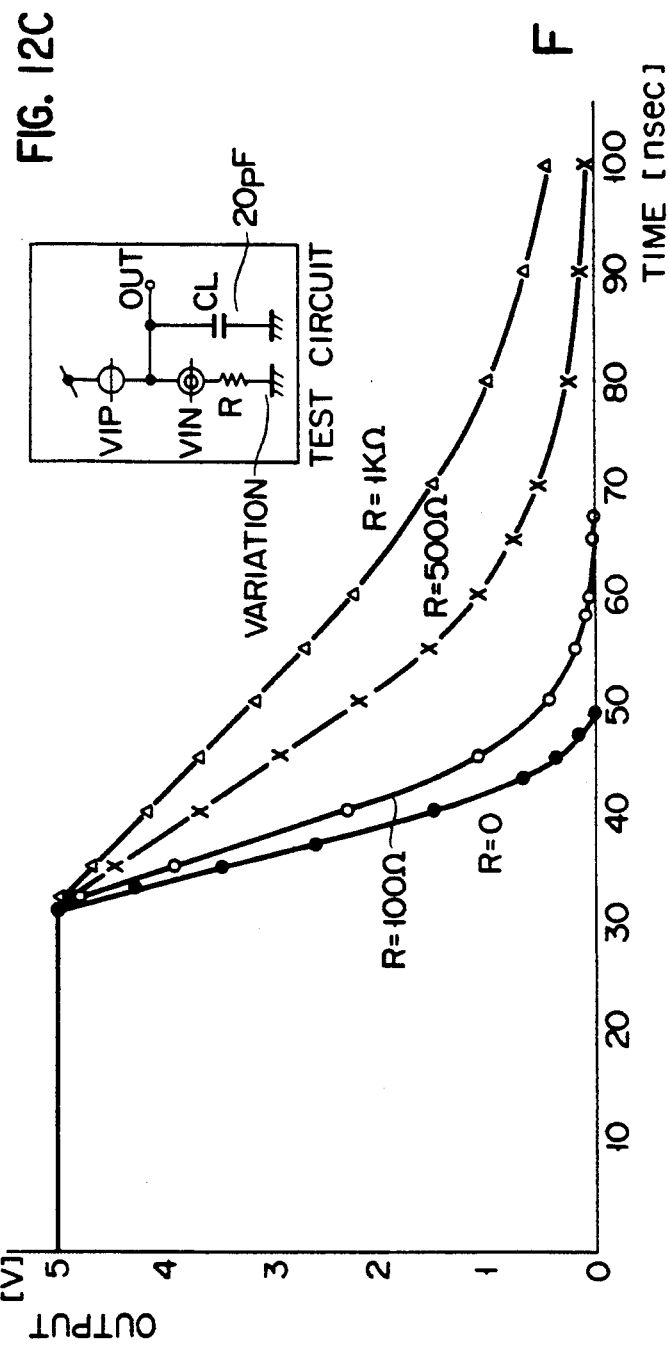
FIG. 12B graphically shows a simulation result of the conventional semiconductor intregated circuit device.

FIGS. 12A–12C graphically show a simulation result obtained from the semiconductor integrated circuit according to the present invention. One of measurement, the resistance in the conventional circuit is 30 Ω and the resistance in the circuit of the present invention is 120 Ω or 1K. FIG. 12B indicates that the circuit of a background art, to which the present invention is not applied, requires 10 nsec or 25 nsec from the turn on of 5 V to a time when the data bus potential (i.e., the potential of OUT) reaches to 2.5 V, while the circuit of the present invention requires only 6 nsec.

As described above, since the semiconductor integrated circuit according to the present invention is constructed such that the power supply wires exclusively for the bus driver circuit are arranged within the wiring region, data can be transferred at high speed without degrading the discharge characteristic of the bus driver circuit.

What is claimed is:

1. A computer system formed on a silicon chip, comprising:
   a CPU formed on the silicon chip;
   an input/output port formed on the silicon chip;
   a plurality of signal bus line means formed on the silicon chip, for transferring data between the CPU and the input/output port, the signal bus line means including parallel signal bus lines which correspond in number to data bits processed by the CPU at one time, wherein no other signal lines are formed between the signal bus lines of said signal bus line means;

a ground potential wire formed on the silicon chip and being parallel to the signal bus lines of the plurality of signal bus line means, wherein no other signal lines are formed between the signal bus lines of the bus line means and the ground potential wire; and a plurality of bus line driving means formed on the silicon chip and directly under the parallel signal bus lines of the signal bus line means and the ground potential wire, and connected to the parallel signal bus lies of the bus line and including at lest one FET, for determining a logical level of the signal bus line means.

2. The computer system according to claim 1, wherein said signal bus line means comprises eight lines.

3. The computer system according to claim 2, wherein said ground potential wire includes aluminum.

4. The computer system according to claim 2, wherein said ground potential wire includes gold.

5. The computer system according to claim 2, wherein said ground potential wire includes silver.

6. The computer system according to claim 2, wherein said ground potential wire includes tungsten.

7. The computer system according to claim 2, wherein said bus line driving means comprises a plurality of FETs.

8. The computer system according to claim 2, wherein said ground potential wire is formed in the center of a plurality of said bus line driving means.

9. The computer system according to claim 1, wherein said signal bus line means comprises sixteen signal bus lines.

10. The computer system according to claim 9, wherein said ground potential wire includes aluminum.

11. The computer system according to claim 9 wherein said ground potential wire includes gold.

12. The computer system according to claim 9, wherein said ground potential wire includes silver.

13. The computer system according to claim 9, wherein said ground potential wire includes tungsten.

14. The computer system according to claim 9, wherein said ground potential wire is interposed between said plurality of bus line driving means.

15. The computer system according to claim 14, wherein said ground potential wire is plural.

16. The computer system according to claim 9, wherein said bus line driving means comprises a plurality of FETs.

17. The computer system according to claim 1, wherein said bus line driving means includes a plurality of FETs.

18. The computer system according to claim 1, wherein said signal bus line mean comprises thirty-two signal bus lines.

19. A computer system according to claim 1, wherein the ground potential wire is interposed between the plurality of signal bus lines.

20. A computer system according to claim 19, further comprising another ground potential wire being interposed between the plurality of signal bus lines.

* * * * *